US009553428B2

(12) United States Patent
Nagai et al.

(10) Patent No.: US 9,553,428 B2
(45) Date of Patent: Jan. 24, 2017

(54) POWER SUPPLY MODULE

(71) Applicant: Murata Manufacturing Co., Ltd., Nagaokakyo-shi, Kyoto-fu (JP)

(72) Inventors: Jun Nagai, Nagaokakyo (JP); Masanori Tsubono, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 308 days.

(21) Appl. No.: 13/851,986

(22) Filed: Mar. 28, 2013

(65) Prior Publication Data

US 2013/0265723 A1 Oct. 10, 2013

(30) Foreign Application Priority Data

Apr. 9, 2012 (JP) .................................. 2012-088342

(51) Int. Cl.
*H02B 1/56* (2006.01)
*H05K 7/20* (2006.01)

(52) U.S. Cl.
CPC ................ *H02B 1/56* (2013.01); *H05K 7/209* (2013.01)

(58) Field of Classification Search
CPC .......... H02B 1/56; H05K 7/209; H05K 1/0201
USPC .......... 361/709, 711, 714, 719, 820
See application file for complete search history.

(56) References Cited

U.S. PATENT DOCUMENTS

| 4,218,578 | A | * | 8/1980 | Olschewski et al. ......... 174/372 |
| 5,959,842 | A | * | 9/1999 | Leonard et al. ............. 361/752 |
| 6,411,507 | B1 | | 6/2002 | Akram |
| 7,534,968 | B2 | * | 5/2009 | English et al. ............... 174/382 |
| 7,944,046 | B2 | * | 5/2011 | Chao ....................... H01L 23/10 165/185 |
| 2007/0017701 | A1 | * | 1/2007 | Liang ...................... H01L 23/367 174/350 |
| 2011/0205710 | A1 | | 8/2011 | Kondo et al. |
| 2013/0088836 | A1 | | 4/2013 | Kuroda |

FOREIGN PATENT DOCUMENTS

| CN | 101524011 A | 9/2009 |
| CN | 102164468 A | 8/2011 |
| JP | 11-163566 A | 6/1999 |
| JP | 2002-190684 A | 7/2002 |
| JP | 2002-271064 A | 9/2002 |
| JP | 2006-303374 A | 11/2006 |
| WO | 2011/148665 A1 | 12/2011 |
| WO | 2011/158615 A1 | 12/2011 |

OTHER PUBLICATIONS

Official Communication issued in corresponding Japanese Patent Application No. 2012-088342, mailed on Oct. 7, 2014.
Official Communication issued in corresponding Chinese Patent Application No. 2013101144956, mailed on May 26, 2015.

* cited by examiner

*Primary Examiner* — Tuan T Dinh
*Assistant Examiner* — Mukund G Patel
(74) *Attorney, Agent, or Firm* — Keating & Bennett, LLP

(57) ABSTRACT

A power supply module includes a circuit board and a heatsink plate. The circuit board includes a first principal surface, a second principal surface, and side surfaces. Electronic components are mounted on the first principal surface. The heatsink plate includes a plate-shaped body portion that faces the first principal surface, and a plurality of fixing portions that extend at an angle from the body portion to face the side surfaces. The fixing portions are configured to come into contact with the second principal surface to secure the body portion to the circuit board.

14 Claims, 4 Drawing Sheets

Prior Art  500

POWER SUPPLY MODULE

BACKGROUND OF THE INVENTION

1. Field of the Invention

The present invention relates to a power supply module, and particularly to a power supply module that includes a circuit board with electronic components mounted thereon.

2. Description of the Related Art

As an invention related to a power supply module of the related art, a housing for electronic components is known, which is described, for example, in Japanese Unexamined Patent Application Publication No. 2002-271064. FIG. 4 is a cross-sectional view illustrating a structure of a housing 500 for electronic components, described in Japanese Unexamined Patent Application Publication No. 2002-271064.

The housing 500 includes an upper case 504 and a lower case 506 and contains a printed circuit board 502. The upper case 504 is disposed on the upper side of the printed circuit board 502. The lower case 506 is disposed on the lower side of the printed circuit board 502. The printed circuit board 502 and the lower case 506 are sandwiched from above and below by the upper case 504. The printed circuit board 502, the upper case 504, and the lower case 506 are thus formed into a single unit.

The housing 500 described in Japanese Unexamined Patent Application Publication No. 2002-271064 requires two components, the upper case 504 and the lower case 506, and has a problem in terms of the number of components required.

SUMMARY OF THE INVENTION

Accordingly, preferred embodiments of the present invention provide a power supply module that includes fewer components than conventional devices.

A power supply module according to a preferred embodiment of the present invention includes a circuit board including a first principal surface, a second principal surface, and side surfaces, the circuit board including electronic components mounted on the first principal surface; and a heatsink plate including a plate-shaped body portion that faces the first principal surface and a plurality of fixing portions that extend at an angle from the body portion to face the side surfaces, the fixing portions being configured to come into contact with the second principal surface to secure the body portion to the circuit board.

Various preferred embodiments of the present invention provide a power supply module that includes fewer components than conventional devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A power supply module according to preferred embodiments of the present invention will now be described.

A configuration of a power supply module according to a preferred embodiment of the present invention will be described with reference to the drawings.

Figure 1:
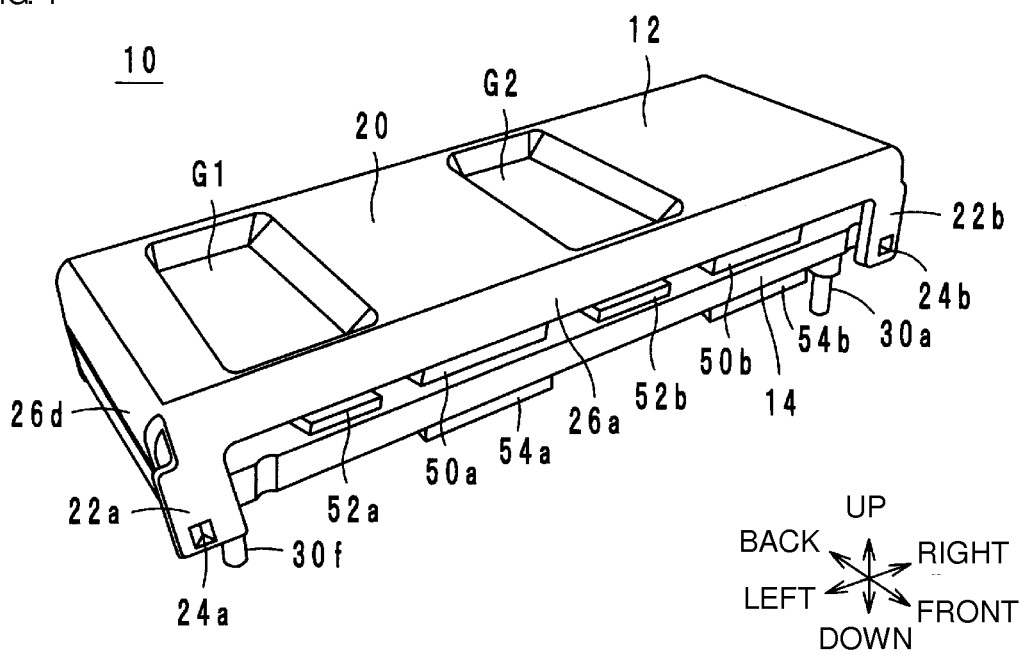
FIG. 1 is an outside perspective view of a power supply module according to a preferred embodiment of the present invention.
Figure 2:
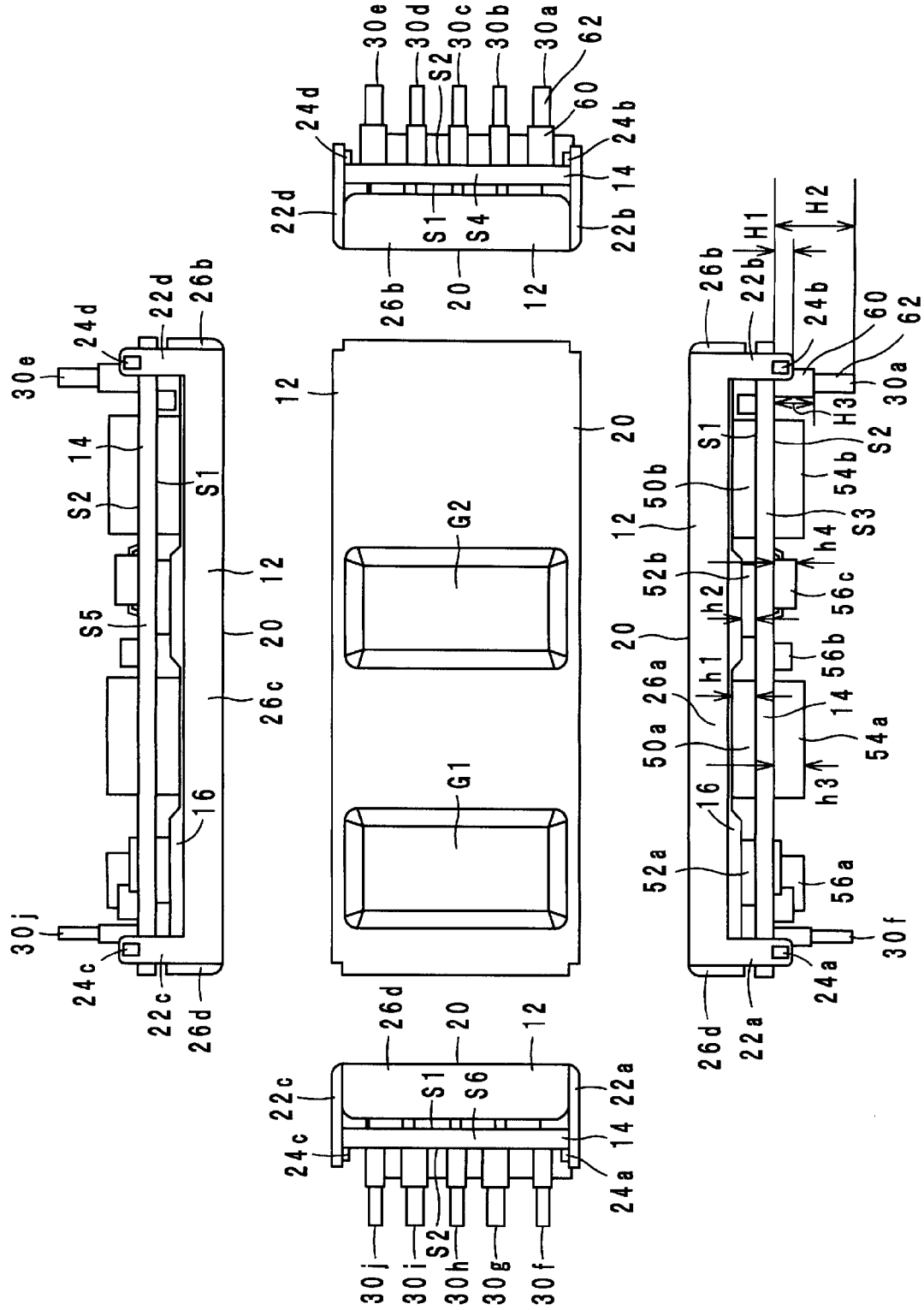
FIG. 2 is a five-side view of the power supply module illustrated in FIG. 1.
Figure 3:
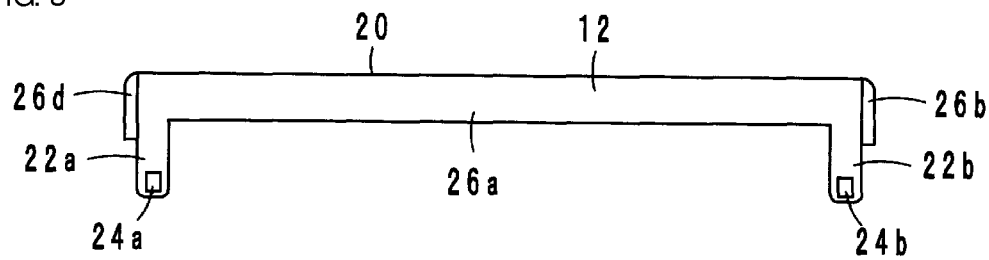
FIG. 3 is an exploded view of the power supply module illustrated in FIG. 1.
Figure 3:
Figure 3:
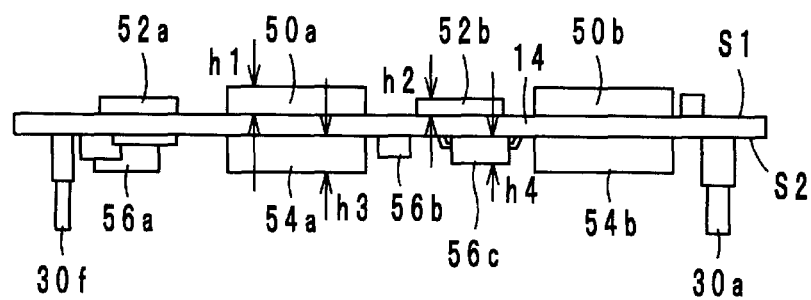
Figure 3:
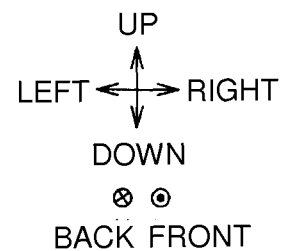
Figure 4:
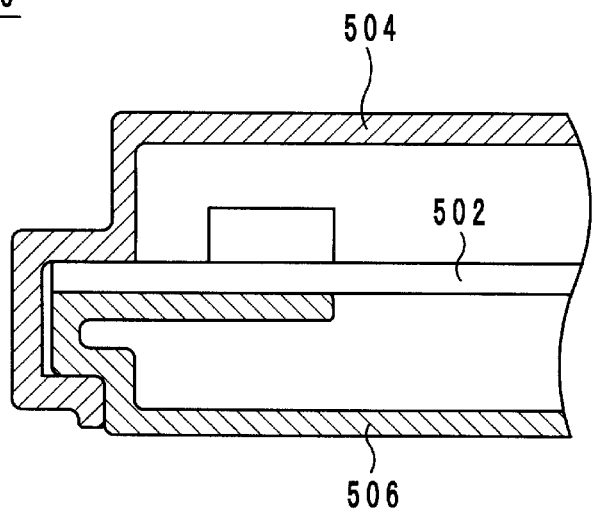
FIG. 4 is a cross-sectional view illustrating a structure of a housing for electronic components, described in Japanese Unexamined Patent Application Publication No. 2002-271064.

FIG. 1 is an outside perspective view of a power supply module 10 according to a preferred embodiment of the present invention. FIG. 2 is a five-side view of the power supply module illustrated in FIG. 1. FIG. 3 is an exploded view of the power supply module 10 illustrated in FIG. 1. In the following description, the up-and-down direction in FIG. 1 is simply referred to as an up-and-down direction. In plan view as viewed from above in FIG. 1, the direction in which shorter sides of the power supply module 10 extend is defined as a front-and-back direction, and the direction in which longer sides of the power supply module 10 extend is defined as a right-and-left direction.

The power supply module 10 is a direct-current (DC) or alternating-current (AC) power supply circuit. As illustrated in FIG. 1 to FIG. 3, the power supply module 10 includes a heatsink plate 12, a circuit board 14, and a heatsink sheet member 16.

The circuit board 14 preferably is a multilayered circuit board which is made of resin material and is substantially rectangular in plan view as viewed from above. The circuit board 14 includes principal surfaces S1 and S2 and side surfaces S3 to S6. The principal surface S1 is a surface located on the upper side. The principal surface S2 is a surface located on the lower side. The side surface S3 is a surface located on the front side. The side surface S4 is a surface located on the right side. The side surface S5 is a surface located on the back side. The side surface S6 is a surface located on the left side. A circuit including copper conductors or the like is disposed on the principal surfaces S1 and S2 and inside the circuit board 14.

As illustrated in FIG. 1 to FIG. 3, electronic components 50a, 50b, 52a, and 52b are mounted on the principal surface S1 of the circuit board 14. As illustrated in FIG. 2 and FIG. 3, a height h2 of the electronic components 52a and 52b from the principal surface S1 in the up-and-down direction is smaller than a height h1 of the electronic components 50a and 50b from the principal surface S1 in the up-and-down direction.

As illustrated in FIG. 1 to FIG. 3, electronic components 54a, 54b, and 56a to 56c are mounted on the principal surface S2 of the circuit board 14. As illustrated in FIG. 2 and FIG. 3, a height h4 of the electronic components 56a to 56c from the principal surface S2 in the up-and-down direction is smaller than a height h3 of the electronic component 54a and 54b from the principal surface S2 in the up-and-down direction.

The electronic components 50a and 54a face each other in the up-and-down direction, with the circuit board 14 interposed therebetween, to define, for example, a ferrite core. Similarly, the electronic components 50b and 54b face each other in the up-and-down direction, with the circuit board 14 interposed therebetween, to define, for example, a ferrite core. A choke coil or transformer is formed when such a ferrite core is configured to pass through a coil pattern in the circuit board 14. The electronic component 52a and 52b preferably are semiconductor devices. For example, the electronic component 52a and 52b preferably are switching devices, such as field-effect transistors (FETs). The electronic components 52a and 52b are devices that generate heat more easily than the electronic components 50a, 50b, 54a, and 54b. The electronic components 50a, 50b, 52a, 52b, 54a, 54b, and 56a to 56c and the circuit in the circuit board 14 define a power supply circuit.

The circuit board 14 is provided with external connection terminals 30a to 30j protruding downward from the principal surface S2. As illustrated in FIG. 2, the external connection terminals 30a to 30e are aligned in this order from the front to the back, along the right (shorter) side of the principal surface S2. Also as illustrated in FIG. 2, the external connection terminals 30f to 30j are aligned in this order from the front to the back, along the left (shorter) side of the principal surface S2.

A height H2 indicates the height of the external connection terminals 30a to 30j from the principal surface S2 in the up-and-down direction. The external connection terminals 30a to 30j preferably are stepped pins. As illustrated in FIG. 2, the external connection terminals 30a to 30j have each a base portion 60 and an end portion 62. For simplicity of the drawing, these reference numerals are given only to the base portion 60 and the end portion 62 of the external connection terminal 30a in FIG. 2. The base portion 60 is the upper portion of each of the external connection terminals 30a to 30j, and has a diameter greater than that of the end portion 62. A height H3 indicates the height of the base portion 60 from the principal surface S2 in the up-and-down direction. The end portion 62 is the lower portion of each of the external connection terminals 30a to 30j, and has a diameter smaller than that of the base portion 60. When the power supply module 10 is mounted on another circuit board or apparatus, the end portions 62 are inserted into the circuit board or apparatus. However, the base portions 60 are not inserted into the circuit board or apparatus in this case. Thus, when the power supply module 10 is mounted on another circuit board or apparatus, the circuit board 14 is held at the height H3 from the circuit board or apparatus.

The height H3 of the base portions 60 from the principal surface S2 in the up-and-down direction is greater than the height h3 of the electronic components 54a and 54b from the principal surface S2 in the up-and-down direction. Therefore, when the power supply module 10 is mounted on another circuit board or apparatus, the electronic components 54a and 54b can be prevented from coming into contact with the circuit board or apparatus.

The heatsink plate 12 preferably includes a single metal plate (aluminum plate). The heatsink plate 12 preferably includes a body portion 20, fixing portions 22a to 22d, and bent portions 26a to 26d.

The body portion 20 preferably is a plate-shaped member located above the circuit board 14 to face the principal surface S1. In plan view as viewed from above, the body portion 20 is a substantially rectangular member having the same or substantially the same size as the circuit board 14. As illustrated in FIG. 1 and FIG. 3, the body portion 20 is provided with recessed portions G1 and G2 extending downward (or toward the circuit board 14). In plan view as viewed from above (in the direction of the normal to the principal surface S1), the recessed portions G1 and G2 overlap with the electronic components 52a and 52b, respectively. It is preferable that the depth of the recessed portions G1 and G2 be substantially the same as the difference between the height h1 and the height h2.

The fixing portions 22a to 22d extend at an angle from the body portion 20 to face the corresponding side surfaces S3 and S5. The fixing portions 22a to 22d then come into contact with the principal surface S2 to secure the body portion 20 to the circuit board 14. Specifically, the fixing portion 22a preferably is a belt-shaped member extending in the up-and-down direction. The fixing portion 22a extends downward at an angle from the body portion 20 at the left end of the front (longer) side of the body portion 20. The fixing portion 22a faces the circuit board 14 near the left end of the side surface S3 and extends to a position below the circuit board 14. The fixing portion 22a is provided with a protrusion 24a at an end portion thereof extending below the circuit board 14. The protrusion 24a protrudes backward from the fixing portion 22a. The protrusion 24a is in contact with the principal surface S2 near the left end of the front (longer) side of the principal surface S2.

The fixing portion 22b preferably is a belt-shaped member extending in the up-and-down direction. The fixing portion 22b extends downward at an angle from the body portion 20 at the right end of the front (longer) side of the body portion 20. The fixing portion 22b faces the circuit board 14 near the right end of the side surface S3 and extends to a position below the circuit board 14. The fixing portion 22b is provided with a protrusion 24b at an end portion thereof extending below the circuit board 14. The protrusion 24b protrudes backward from the fixing portion 22b. The protrusion 24b is in contact with the principal surface S2 near the right end of the front (longer) side of the principal surface S2.

The fixing portion 22c preferably is a belt-shaped member extending in the up-and-down direction. The fixing portion 22c extends downward at an angle from the body portion 20 at the left end of the back (longer) side of the body portion 20. The fixing portion 22c faces the circuit board 14 near the left end of the side surface S5 and extends to a position below the circuit board 14. Thus, the fixing portions 22a and 22c face each other in the front-and-back direction, with the circuit board 14 interposed therebetween. The fixing portion 22c is provided with a protrusion 24c at an end portion thereof extending below the circuit board 14. The protrusion 24c protrudes forward from the fixing portion 22c. The protrusion 24c is in contact with the principal surface S2 near the left end of the back (longer) side of the principal surface S2.

The fixing portion 22d preferably is a belt-shaped member extending in the up-and-down direction. The fixing portion 22d extends downward at an angle from the body portion 20 at the right end of the back (longer) side of the body portion 20. The fixing portion 22d faces the circuit board 14 near the right end of the side surface S5 and extends to a position below the circuit board 14. Thus, the fixing portions 22b and 22d face each other in the front-and-back direction, with the circuit board 14 interposed therebetween. The fixing portion 22d is provided with a protrusion 24d at an end portion thereof extending below the circuit board 14. The protrusion 24d protrudes forward from the fixing portion 22d. The protrusion 24d is in contact with the principal surface S2 near the right end of the back (longer) side of the principal surface S2. Thus, the fixing portions 22a to 22d secure the heatsink plate 12 in place at the four corners of the circuit board 14.

As illustrated in FIG. 2, a height H1 indicates the height of the fixing portions 22a to 22d from the principal surface S2 in the up-and-down direction. The height H1 is smaller than the height H2. Thus, since the lower ends of the end portions 62 of the external connection terminals 30a to 30j are located below the lower ends of the fixing portions 22a to 22d, the end portions 62 can be inserted into another circuit board or apparatus. The height H1 is preferably smaller than the height H3. Thus, when the entire end portions 62 are inserted into another circuit board or apparatus, the fixing portions 22a to 22d can be prevented from coming into contact with the circuit board or apparatus.

The bent portions 26a to 26d extend at an angle from the body portion 20 in the same direction as the fixing portions 22a to 22d (i.e., the bent portions 26a to 26d extend downward). The bent portions 26a to 26d have a height smaller than that of the fixing portions 22a to 22d from the body portion 20 in the up-and-down direction. Specifically, the bent portion 26a extends along the front (longer) side of the body portion 20. The bent portion 26a is connected, at both ends thereof in the right-and-left direction, to the fixing portions 22a and 22b. The bent portion 26a does not face the side surface S3 of the circuit board 14. Thus, the bent portion 26a is separated by a gap from the circuit board 14.

The bent portion 26b extends along the right (shorter) side of the body portion 20. The bent portion 26b does not face the side surface S4 of the circuit board 14. Thus, the bent portion 26b is separated by a gap from the circuit board 14.

The bent portion 26c extends along the back (longer) side of the body portion 20. The bent portion 26c is connected, at both ends thereof in the right-and-left direction, to the fixing portions 22c and 22d. The bent portion 26c does not face the side surface S5 of the circuit board 14. Thus, the bent portion 26c is separated by a gap from the circuit board 14.

The bent portion 26d extends along the left (shorter) side of the body portion 20. The bent portion 26d does not face the side surface S6 of the circuit board 14. Thus, the bent portion 26d is separated by a gap from the circuit board 14.

The heatsink plate 12 is formed preferably by die-cutting, bending, and press working a single metal plate, for example. Specifically, the fixing portions 22a to 22d and the bent portions 26a to 26d are formed preferably by bending, and the protrusions 24a to 24d and the recessed portions G1 and G2 are formed preferably by press working, for example.

As illustrated in FIG. 3, the heatsink sheet member 16 is interposed between the principal surface S1 and the body portion 20. The heatsink sheet member 16 is in contact with the electronic components 50a, 50b, 52a, and 52b and the body portion 20. The heatsink sheet member 16 is made of material having good heat dissipation properties. For example, the heatsink sheet member 16 is preferably made of a silicone compound. The heatsink sheet member 16 preferably has elasticity.

The power supply module 10 configured as described above includes fewer components than conventional devices. Specifically, the heatsink plate 12 extends downward at an angle from the body portion 20 to face the side surfaces S3 and S5 and come into contact with the principal surface S2. Thus, the heatsink plate 12 is secured to the circuit board 14. The heatsink plate 12 of the power supply module 10 is composed of a single component. This means that the power supply module 10 includes fewer components than the housing 500 described in Japanese Unexamined Patent Application Publication No. 2002-271064.

In the power supply module 10, the heatsink plate 12 is secured to the circuit board 14 by the fixing portions 22a to 22d that form and define a portion of the heatsink plate 12. Therefore, the power supply module 10 does not require any screws or fittings for securing the heatsink plate 12 to the circuit board 14. This means again that the power supply module 10 includes fewer components than conventional devices.

In the power supply module 10, the heatsink plate 12 is formed preferably by bending and press working a single metal plate. A mold used for bending and press working is less costly than that for casting. Therefore, the cost of producing the heatsink plate 12 is lower than that of producing a heatsink plate by casting.

The power supply module 10 can achieve a high heat dissipation effect. Specifically, the body portion 20 is provided with the recessed portions G1 and G2 extending toward the circuit board 14. In plan view as viewed from above, the recessed portions G1 and G2 overlap with the electronic components 52a and 52b, respectively, having the height h2 that is smaller than the height h1 of the electronic components 50a and 50b. This reduces the distance between the body portion 20 and the electronic components 52a and 52b. Thus, heat generated by the electronic components 52a and 52b is efficiently transferred via the heatsink sheet member 16 to the body portion 20. With the recessed portions G1 and G2 of the body portion 20, the distance between the body portion 20 and the electronic components 52a and 52b is close to that between the body portion 20 and the electronic components 50a and 50b. This means that the magnitude of force applied from the electronic components 52a and 52b to the body portion 20 is close to that applied from the electronic components 50a and 50b to the body portion 20. It is thus possible to reduce concentration of stress on portions of the body portion 20.

The height H1 of the fixing portions 22a to 22d from the principal surface S2 in the up-and-down direction is smaller than the height H2. Thus, since the lower ends of the end portions 62 of the external connection terminals 30a to 30j are located below the lower ends of the fixing portions 22a to 22d, the end portions 62 can be inserted into another circuit board or apparatus. The height H1 is smaller than the height H3 of the base portions 60 of the external connection terminals 30a to 30j from the principal surface S2 in the up-and-down direction. Thus, when the entire end portions 62 are inserted into another circuit board or apparatus, the fixing portions 22a to 22d can be prevented from coming into contact with the circuit board or apparatus.

The heatsink plate 12 has the bent portions 26a to 26d extending at an angle from the body portion 20 in the same direction as the fixing portions 22a to 22d. Since this increases the moment of inertia of area of the body portion 20, the strength of the body portion 20 is improved. As described above, the bent portions 26a and 26c are connected, at their both ends in the right-and-left direction, to the corresponding fixing portions 22a to 22d. This reduces the possibility of damage to the fixing portions 22a to 22d.

As illustrated in FIG. 3, the heatsink sheet member 16 is interposed between the principal surface S1 and the body portion 20 and is in contact with the electronic components 50a, 50b, 52a, and 52b and the body portion 20. Thus, heat generated by the electronic components 50a, 50b, 52a, and 52b is transferred via the heatsink sheet member 16 to the body portion 20. This improves the heat dissipation properties of the power supply module 10.

The heatsink sheet member 16 has elasticity. Thus, the heatsink sheet member 16 presses the body portion 20 and the circuit board 14 upward and downward, respectively. Since this causes the protrusions 24a to 24d to be firmly pressed against the circuit board 14, it is possible to reduce looseness of the circuit board 14 in the up-and-down direction with respect to the heatsink plate 12. With the heatsink sheet member 16 having elasticity, the electronic components 50a, 50b, 52a, and 52b are prevented from directly coming into contact with the body portion 20. Thus, since a force applied from the electronic components 50a, 50b, 52a, and 52b to the body portion 20 is distributed by the heatsink sheet member 16 over the entire body portion 20, it is possible to reduce concentration of stress on portions of the body portion 20.

The heatsink plate 12 is formed preferably by bending and press working a single metal plate. For better workability, a thin metal plate is used to make the heatsink plate 12. Therefore, the power supply module 10 is lighter in weight and lower in profile than a power supply module that includes a heatsink plate produced by casting.

Other Preferred Embodiments

The power supply module according to the present invention is not limited to the power supply module 10 of the preferred embodiment described above, and may be changed within the scope of the present invention.

In the power supply module 10, the fixing portions 22a to 22d preferably have the protrusions 24a to 24d formed by press working, for example. The protrusions 24a to 24d preferably are in contact with the principal surface S2 of the circuit board 14 to secure the heatsink plate 12 to the circuit board 14. However, the heatsink plate 12 may be secured to the circuit board 14 in other ways. For example, the fixing portions 22a and 22b may be bent backward at the lower ends thereof to come into contact with the principal surface S2, and the fixing portions 22c and 22d may be bent forward at the lower ends thereof to come into contact with the principal surface S2. In this case, the fixing portions 22a to 22d cannot be bent if lower end portions thereof are not long enough to allow bending. It is thus necessary to ensure that the lower end portions of the fixing portions 22a to 22d are long enough to be bent. Bending the fixing portions 22a to 22d increases the contact area where the fixing portions 22a to 22d are in contact with the principal surface S2. This means that the heatsink plate 12 is more firmly secured to the circuit board 14.

Note that although bending the fixing portions 22a to 22d increases the contact area where the fixing portions 22a to 22d are in contact with the principal surface S2, this results in a decrease in area for mounting electronic components on the principal surface S2. To allow mounting of more electronic components, it is preferable to use the protrusions 24a to 24d described above.

Although the circuit board 14 and the body portion 20 preferably are substantially rectangular in plan view as viewed from above, for example, their shape is not limited to this.

The positions where the fixing portions 22a to 22d are in contact with the principal surface S2 of the circuit board 14 are not limited to the four corners of the principal surface S2. The fixing portions 22a to 22d may be in contact with the principal surface S2 at any positions, as long as the fixing portions 22a to 22d can secure the heatsink plate 12 to the circuit board 14. For the fixing portions 22a to 22d to secure the heatsink plate 12 to the circuit board 14, it is only necessary that two of the fixing portions 22a to 22d be disposed to face one side surface of the circuit board 14 and that the other two of the fixing portions 22a to 22d be disposed to face the opposite side surface of the circuit board 14. Thus, the circuit board 14 is sandwiched between the fixing portions 22a to 22d.

Various preferred embodiments of the present invention are useful when applied to power supply modules, and particularly advantageous in reducing the number of components of such power supply modules.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply module comprising:
a circuit board including a first principal surface, a second principal surface, and side surfaces, the circuit board including electronic components mounted on the first principal surface;
a heatsink plate including a plate-shaped body portion that faces the first principal surface and a plurality of fixing portions that extend at an angle from the body portion to face the side surfaces, the fixing portions being configured to come into contact with the second principal surface to secure the body portion to the circuit board; and
a sheet member having elasticity and being arranged between the first principal surface and the body portion such that the sheet member presses against and is in contact with the body portion and at least one of the electronic components mounted on the first principal surface; wherein
the fixing portions are each provided with a protrusion in contact with the second principal surface;
the body portion includes a recessed portion extending toward the circuit board such that a distance from a portion of the body portion including the recessed portion to the circuit board is less than a distance from portions of the body portion not including the recessed portion to the circuit board;
the electronic components include a first electronic component and a second electronic component;
a height h2 of the second electronic component from the first principal surface is smaller than a height h1 of the first electronic component from the first principal surface;
the recessed portion overlaps with the second electronic component in a plan view in a direction perpendicular to the first principal surface;
the portions of the body portion not including the recessed portion overlap with the first electronic component in the plan view; and
a depth of the recessed portion is substantially the same as a difference between the height h1 and the height h2.

2. The power supply module according to claim 1, wherein the heatsink plate is defined by a single metal plate.

3. The power supply module according to claim 2, wherein the single metal plate is made of aluminum.

4. The power supply module according to claim 1, wherein the second electronic component is a semiconductor device.

5. The power supply module according to claim 1, wherein the heatsink plate is made of a material that is bent and press worked.

6. The power supply module according to claim 1, wherein the circuit board is provided with a plurality of external connection terminals protruding from the second principal surface; and a height of the external connection terminals from the second principal surface is greater than a height of the fixing portions from the second principal surface.

7. The power supply module according to claim 1, wherein the heatsink plate includes a plurality of bent portions extending at an angle from the body portion in a same direction as the fixing portions, the bent portions having a height smaller than a height of the fixing portions from the body portion.

8. The power supply module according to claim 1, wherein the power supply module is a direct-current power supply circuit or an alternating current power supply circuit.

9. The power supply module according to claim 1, wherein the circuit board is a multilayered circuit board made of an insulating material.

10. The power supply module according to claim 1, wherein the electronic components define a ferrite core with the circuit board.

11. The power supply module according to claim 10, wherein the ferrite core extends through a coil pattern in the circuit board to define a choke coil or a transformer.

12. The power supply module according to claim 1, wherein the electronic components are one of semiconductor devices, switching devices and field-effect transistors.

13. The power supply module according to claim 1, wherein each of the plurality of fixing portions includes a belt-shaped member.

14. The power supply module according to claim 1, wherein the height h1 of the first electronic component is substantially equal to the distance from portions of the body portion not including the recessed portion to the circuit board.

* * * * *